(12) United States Patent  (10) Patent No.: US 9,219,238 B2
Zhang                      (45) Date of Patent:     Dec. 22, 2015

(54) ORGANIC THIN FILM TRANSISTOR ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventor: Xuehui Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/985,195

(22) PCT Filed: Dec. 14, 2012

(86) PCT No.: PCT/CN2012/086700
§ 371 (c)(1),
(2) Date: Aug. 13, 2013

(87) PCT Pub. No.: WO2014/015627
PCT Pub. Date: Jan. 30, 2014

(65) Prior Publication Data
US 2014/0061615 A1    Mar. 6, 2014

(30) Foreign Application Priority Data

Jul. 25, 2012  (CN) .......................... 2012 1 0260594

(51) Int. Cl.
*H01L 51/05* (2006.01)
*H01L 27/28* (2006.01)
(Continued)

(52) U.S. Cl.
CPC ...... *H01L 51/0512* (2013.01); *G02F 1/136286* (2013.01); *H01L 27/283* (2013.01); *H01L 27/3274* (2013.01); *H01L 51/10* (2013.01); *H01L 51/0541* (2013.01)

(58) Field of Classification Search
USPC ...................................... 257/40; 438/99, 161
See application file for complete search history.

(56) References Cited

U.S. PATENT DOCUMENTS 6,403,408 B1 *    6/2002  Green et al. ................... 438/161
2004/0238814 A1 * 12/2004  Mizusaki et al. ............... 257/40
(Continued)

FOREIGN PATENT DOCUMENTS

AD    102779785 A    11/2012
CN    101105615 A     1/2008
(Continued)

OTHER PUBLICATIONS

Korean Office Action dated Apr. 21, 2014; Appln. No. 10-2013-7018812.
(Continued)

*Primary Examiner* — Eduardo A Rodela
*Assistant Examiner* — Vincent Wall
(74) *Attorney, Agent, or Firm* — Ladas & Parry LLP

(57) ABSTRACT

Disclosed is an organic thin film transistor array substrate and a method for manufacturing. The method increases the manufacturing efficiency of the organic thin film transistor array substrate. In the method, a pixel electrode, a source electrode, a data line and a drain electrode are formed on a substrate through one patterning process, where both of the pattern layer for the source electrode and the pattern layer for the data line and the drain electrode are located above the pixel electrode. An organic semiconductor layer and a gate insulating layer that covers the organic semiconductor layer are formed through one patterning process, where the organic semiconductor layer covers both of the pattern layer for the source electrode and the pattern layer for the data line and the drain electrode. A gate electrode and a gate line are formed through one patterning process on the substrate formed with the gate insulating layer.

7 Claims, 6 Drawing Sheets

(51) Int. Cl.
    *H01L 27/32*   (2006.01)
    *H01L 51/10*   (2006.01)
    *G02F 1/1362*  (2006.01)

(56) References Cited

U.S. PATENT DOCUMENTS

| | | | |
|---|---|---|---|
| 2006/0094172 A1* | 5/2006 | Lee et al. | 438/149 |
| 2008/0002124 A1* | 1/2008 | Yang | 349/139 |
| 2008/0049158 A1 | 2/2008 | Choi | |
| 2009/0146138 A1 | 6/2009 | Aoki | |
| 2011/0006290 A1 | 1/2011 | Noh et al. | |
| 2011/0215406 A1 | 9/2011 | Ono et al. | |
| 2014/0061615 A1 | 3/2014 | Zhang | |

FOREIGN PATENT DOCUMENTS

| | | |
|---|---|---|
| CN | 101131517 A | 2/2008 |
| CN | 101459221 A | 6/2009 |
| CN | 101814581 A | 8/2010 |
| CN | 101944535 A | 1/2011 |
| KR | 20090061594 A | 6/2009 |

OTHER PUBLICATIONS

Second Chinese Office Action dated Apr. 25, 2014; Appln. No. 201210260594.0.

International Search Report dated May 2, 2013; PCT/CN2012/086700.

First Chinese Office Action dated May 11, 2013; Appln. No. 201210260594.0.

Chinese Rejection Decision Issued Jul. 15, 2014; Appln. No. 201210260594.0.

Korean Office Action Appln. No. 10-2013-7018812; Dated Oct. 21, 2013.

International Preliminary Report on Patentability dated Jan. 27, 2015; PCT/CN2012/086700.

Korean Office Action Appln. No. 10-2013-7018812; Dated Apr. 23, 2015.

Korean Notice of Allowance Appln. No. 10-2013-7018812; Dated Jun. 29, 2015.

* cited by examiner though one patterning process; forming an organic semiconductor layer that covers the pattern layer of source electrode and data line and the pattern layer of drain electrode, and a gate insulating layer that covers the organic semiconductor layer through one patterning process; and forming a pattern layer of gate electrode and gate line through one patterning process on the substrate formed with the gate insulating layer.

ORGANIC THIN FILM TRANSISTOR ARRAY SUBSTRATE AND METHOD FOR MANUFACTURING THE SAME, AND DISPLAY DEVICE

TECHNICAL FIELD

Embodiments of the present invention relate to an organic thin film transistor array substrate and a method for manufacturing the same, and a display device.

BACKGROUND

An organic thin film transistor (OTFT) is a logic unit device using an organic semiconductor for an active layer, has advantages of being adaptable for large-scale processing, being applicable for flexible substrates, low process cost, etc. and presents application prospect in the fields of flat panel display, sensor, storage card, radio frequency identification tag, etc. Research and development of organic thin film transistors have obtained worldwide attention.

Generally, an organic thin film transistor array substrate comprises a source electrode, a drain electrode, a data line, a pixel electrode, a gate electrode and a gate line, an organic semiconductor layer, a gate insulating layer, a passivation layer, etc.

In the course of manufacturing the organic thin film transistor array substrate, it is usually necessary to form a pattern layer of source electrode and data line, a pattern layer of drain electrode, a pattern layer of pixel electrode, a pattern layer of gate electrode and gate line, the organic semiconductor layer, the gate insulating layer, the passivation layer and so on.

For forming each of the layers, one patterning process is to be conducted, and use of a mask plate is required in the patterning process. For example, when the pattern layer of source electrode and data line is formed, firstly, a layer of metal thin film is formed on the array substrate, a layer of photoresist is spin-coated on the metal thin film, next, the photoresist is exposed with a mask plate and developed, then the array substrate is etched with a photoresist pattern to etch away the metal thin film in a photoresist removed area, and finally, the remaining photoresist is removed. Up to here, through exposure and development, etching, stripping and other operation(s), the pattern layer of source electrode and data line is formed on the array substrate. The forming process for every other pattern layer is similar.

In the prior method, for forming each of the layers on the organic thin film transistor array substrate, one patterning process needs to be conducted. It is necessary for each of patterning processes to transfer a mask pattern into a thin film pattern, and it is necessary for each pattern layer to cover another thin film pattern layer precisely, and therefore, in the course of fabricating the organic thin film transistor array substrate, the number of the used mask plates is relatively large. Thereby, the production efficiency is low, which leads to a higher production cost.

SUMMARY

Embodiments of the present disclosure provide an organic thin film transistor array substrate and a method for manufacturing the same for increasing the manufacture efficiency of the organic thin film transistor array substrate.

In one aspect of the present disclosure, there is provided a method for manufacturing an organic thin film transistor (OTFT) array substrate, comprising: forming a pattern layer of pixel electrode, a pattern layer of source electrode and data line, and a pattern layer of drain electrode, which are located above the pattern layer of pixel electrode, on a substrate through one patterning process; forming an organic semiconductor layer that covers the pattern layer of source electrode and data line and the pattern layer of drain electrode, and a gate insulating layer that covers the organic semiconductor layer through one patterning process; and forming a pattern layer of gate electrode and gate line through one patterning process on the substrate formed with the gate insulating layer.

In another aspect of the present disclosure, there is further provided an organic thin film transistor (OTFT) array substrate manufactured in accordance with the above method.

In still another aspect of the present disclosure, there is further provided a display device, comprising the above organic thin film transistor (OTFT) array substrate.

In the method according to an embodiment of the present disclosure, three patterning processes are used to fabricate an organic thin film transistor array substrate, so that the fabricating process is simplified, the fabrication cost is reduced, the fabrication time is shortened, and the fabrication efficiency is increased.

BRIEF DESCRIPTION OF THE DRAWINGS

In order to illustrate the technical solution of the embodiments of the present disclosure more clearly, the drawings of the embodiments will be briefly described in the following; it is obvious that the described drawings below are only related to some embodiments of the present disclosure and are not limitative of the invention.

FIG. 1d is a cross-sectional view showing the OTFT after ashing photoresist in a second patterning process in the embodiment of the present disclosure;

FIG. 1e is a cross-sectional view showing the OTFT after a second etching process in the first patterning process in the embodiment of the present disclosure;

FIG. 1f is a cross-sectional view showing the OTFT after stripping off the photoresist in the first patterning process in the embodiment of the present disclosure;

DETAILED DESCRIPTION

Figure 1A:
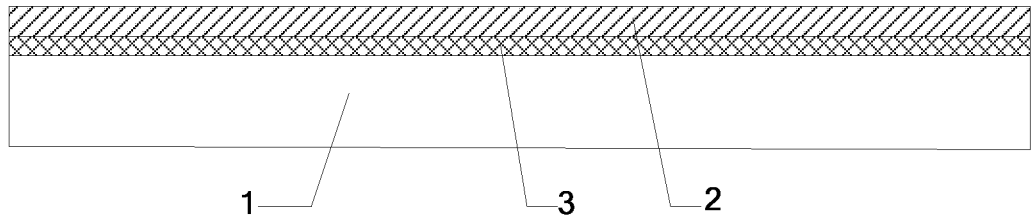
FIG. 1a is a cross-sectional view after a transparent conductive thin film and a metal thin film are formed in an embodiment of the present disclosure.

In order to make objects, technical details and advantages of the embodiments of the present disclosure apparent, hereinafter the technical solutions of the embodiments of the invention will be described in a clearly and fully understandable way in connection with the drawings related to the embodiments of the present disclosure. It is obvious that the described embodiments are just a part but not all of the present disclosure. Based on the described embodiments of the present disclosure, those ordinarily skilled in the art can obtain other embodiment(s), without any inventive work, which should be within the scope sought for protection by the present disclosure.

Unless otherwise defined, the technical or scientific terminology used herein should have the same meaning as commonly understood by one of ordinary skill in the art to which this invention belongs. A term such as "a," "an," "the" or the like does not indicate limitation in number, but specifies the presence of at least one. A term such as "comprise," "comprising," "include," "including", "contain" or the like means that an element or article ahead of this term encompasses element(s) or article(s) listed behind this term and its(their) equivalents, but does not preclude the presence of other elements or articles. A term such as "connection," "connected," or the like is not limited to physical or mechanical connection, but can include electrical connection, whether directly or indirectly. "Upper," "lower," "left," "right" or the like is only used to describe a relative positional relationship, and when the absolute position of a described object is changed, the relative positional relationship might also be changed accordingly.

In order to increase the manufacture efficiency of an organic thin film transistor array substrate, an embodiment of the present disclosure provides two methods for manufacturing an organic thin film transistor array substrate and organic thin film transistor array substrates corresponding to the methods. According to the embodiment of the present disclosure, the manufacture of an array substrate can be completed through three patterning processes.

In the present disclosure, a patterning process is such as a photolithography patterning process, and for example, it comprises: coating a photoresist layer on a structural layer to be patterned, exposing the photoresist layer with a mask plate, developing the exposed photoresist layer to obtain a photoresist pattern, etching the structural layer with the photoresist pattern, and then removing the photoresist pattern optionally.

A method for manufacturing an organic thin film transistor array substrate provided by an embodiment of the present disclosure comprises the following steps:

Step 101: a pattern layer of pixel electrode, and a pattern layer of source electrode and data line and a pattern layer of drain electrode, which are located above the pattern layer of pixel electrode, are formed on a substrate through one patterning process;

Step 102: an organic semiconductor layer that covers the pattern layer of source electrode and data line and the pattern layer of drain electrode, and a gate insulating layer that covers the organic semiconductor layer, are formed through one patterning process;

Step 103: a pattern layer of gate electrode and gate line is formed through one patterning process on the substrate formed with the gate insulating layer.

As to the step 101, the pattern layer of pixel electrode, and the pattern layer of source electrode and data line and the pattern layer of drain electrode, which are located above the pattern layer of pixel electrode, are formed on the substrate through one patterning process, and one example of this step is as follows.

A transparent conductive thin film is formed on the substrate, and then a metal thin film is formed on the transparent conductive thin film.

A photoresist layer is spin-coated on the metal thin film and subjected to exposure with a mask plate and development so as to produce a photoresist removed area, a photoresist partially-retained area and a photoresist fully-retained area. The mask plate may be a half-tone mask plate, a gray-tone mask plate, or the like. Here, there may be formed two photoresist fully-retained areas, one of which corresponds to the pattern layer of source electrode and data line, and the other of which corresponds to the pattern layer of drain electrode. An area between the two photoresist fully-retained areas corresponds to a channel region. The photoresist partially-retained area is located on the side of the photoresist fully-retained area corresponding to the pattern layer of drain electrode and adjoined to the photoresist fully-retained area.

With the resultant pattern of the photoresist as an etching mask, the substrate is etched so that the transparent conductive thin film and the metal thin film in the photoresist fully-removed area are etched away;

the photoresist on the substrate is subjected to ashing so as to remove the photoresist in the photoresist partially-retained area and meanwhile to partially remove the photoresist in the photoresist fully-retained area;

with the remaining pattern of the photoresist as an etching mask, the substrate is etched, so that the metal thin film in the photoresist partially-retained area and obtain the pattern layer of pixel electrode are etched away;

the photoresist in the photoresist fully-retained area is stripped off so as to obtain the pattern layer of source electrode and data line and the pattern layer of drain electrode.

As to the step 102, the organic semiconductor layer that covers the pattern layer of source electrode and data line and the pattern layer of drain electrode, and a gate insulating layer that covers the organic semiconductor layer, are formed through one patterning process, and one example of this step is as follows.

A thin film for the organic semiconductor layer is formed on the substrate formed with the pattern layer of source electrode and data line, the pattern layer of drain electrode and the pattern layer of pixel electrode; next, on the substrate formed with the pattern layer of source electrode and data line, the pattern layer of drain electrode, the pattern layer of pixel electrode and the thin film for the organic semiconductor layer, a thin film for the gate insulating layer is formed;

a photoresist layer is spin-coated on the thin film for the gate insulating layer, and subjected to exposure with a mask plate and development so as to obtain a photoresist removed area and a photoresist fully-retained area, which is disposed corresponding to the pattern layer of source electrode and data line and the pattern layer of drain electrode;

with the resultant pattern of the photoresist as an etching mask, the substrate is etched, so that the thin film for the gate insulating layer and the thin film for the organic semiconductor layer in the photoresist fully-removed area are etched away;

the photoresist in the photoresist fully-retained area is stripped off so as to obtain the pattern layers of the organic semiconductor layer and the gate insulating layer.

For example, after the thin film for the gate insulating layer is formed and before the photoresist layer is spin-coated on the thin film for the gate insulating layer, the substrate may be baked at a first preset temperature for a first preset time period, and is baked at a second preset temperature for a second preset time period, the second preset temperature being larger than the first preset temperature. For example, the first preset temperature is lower than 100 degrees centigrade, and the second preset temperature is higher than 130 degrees centigrade. The first preset time period and the second preset time period may be equal or unequal to each other.

As to the step 103, the pattern layer of gate electrode and gate line is formed through one patterning process on the substrate formed with the gate insulating layer, and one example of this step is as follows.

A gate metal thin film is formed on the substrate formed with the gate insulating layer;

a photoresist layer is spin-coated on the gate metal thin film and subjected to exposure with a mask plate and development, so as to obtain a photoresist fully-removed area and a photoresist fully-retained area;

with the resultant pattern of the photoresist as an etching mask, the substrate is etched so that the gate metal thin film in the photoresist fully-removed area is etched away;

the photoresist is stripped off so as to obtain the pattern layer of gate electrode and gate line.

Figure 3A:
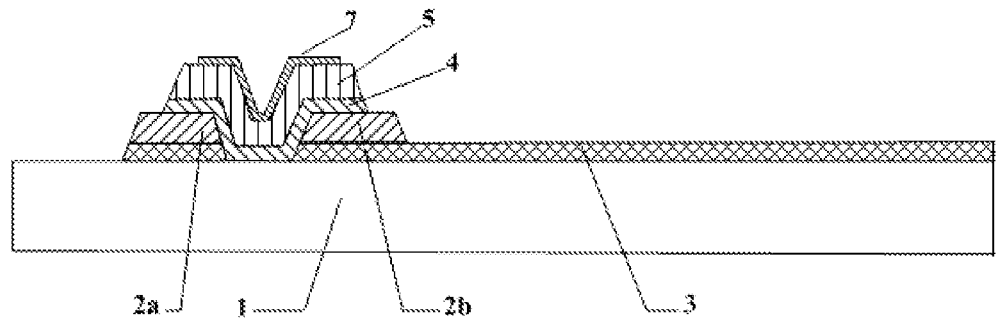
FIG. 3a is a cross-sectional view showing the OTFT after a third patterning process in the embodiment of the present disclosure.

As shown in FIG. 3a, according to an embodiment of the present disclosure, there is provided an organic thin film transistor (OTFT) array substrate manufactured in accordance with the above method, which may include a plurality of gate lines and a plurality of data lines. These gate lines and data lines cross over each other to define a plurality of display regions, and then within each of pixel regions, there are formed a pattern layer 3 of a pixel electrode and an OTFT. The OTFT includes a pattern layer 2a of a source electrode and a data line and a pattern layer of a drain electrode 2b that are located above the pattern layer of the pixel electrode 3, an organic semiconductor layer 4 that covers the pattern layer 2a of the source electrode and the data line and the pattern layer of the drain electrode 2b, a gate insulating layer 5 that covers the organic semiconductor layer 4, and a pattern layer 7 of a gate electrode and a gate line that covers the gate insulating layer 5.

In this embodiment, for example the material for the organic semiconductor layer is one selected from the group consisting of pentacene, tetracene, copper phthalocyanine, vanadyl phthalocyanine, fluorinated copper phthalocyanine, and poly(3-hexylthiophene).

The material for the pattern layer of gate electrode and gate line is such as one selected from the group consisting of golden (Au), silver (Ag), copper (Cu), molybdenum (Mo), aluminum (Al), cadmium (Gr), Au paste, Ag paste, Cu paste, poly(3,4-ethylenedioxythiophene) and polystyrene sulfonate (PEDOT/PSS) or any combination thereof.

The material for the gate insulating layer is such as one or two selected from the group consisting of tantalum pentoxide (Ta2O5), titanium dioxide (TiO2), zirconium dioxide (ZrO2), aluminum oxide (Al2O3), silicon nitride (SiNX), silicon oxide (SiO2), polymethyl methacrylate, polyimide, polyvinyl alcohol, polyvinyl phenol, polyurethane, phenol formaldehyde resin and polyvinylidene fluoride.

The material for the pattern layer of source electrode and data line and the pattern layer of drain electrode is such as one selected from the group of consisting of Au, Ag, Cu, Mo, Gr, Al, Au paste, Ag paste, Cu paste, PEDOT and PSS and any combination thereof.

The material for the substrate is such as glass or plastic.

For example, the method of forming a thin film for the organic semiconductor layer comprises thermal deposition, spin-coating, printing, or the like.

For example, the method of forming a thin film for the gate electrode comprises any one selected from the group consisting of sputtering, electron beam evaporation, thermal deposition, ink-jet printing, screen printing, gravure printing, nano-imprint and micro-contact printing.

For example, the method of forming a thin film for the source and drain electrodes comprises any one selected from the group consisting of sputtering, electron beam evaporation, thermal deposition, ink-jet printing, screen printing, gravure printing, nano-imprint and micro-contact printing.

An organic thin film transistor array substrate and a manufacturing method thereof are provided in embodiments of the present disclosure, so that the pattern layer of source electrode and data line and the pattern layer of pixel electrode are obtained in one patterning, and also the organic semiconductor layer and the gate insulating layer are obtained in one patterning and the gate line and the gate electrode layer are obtained in one patterning. With three patterning processes, the fabrication cost is reduced, and the fabrication efficiency is increased.

According to the present embodiment, there is provided an organic thin film transistor array substrate, comprising a plurality of gate lines and a plurality of data lines, which cross over each other to define a plurality of pixel regions, with a pixel electrode and an organic thin film transistor being fouled within each of the pixel regions. The organic thin film transistor has a top-gate bottom-contact configuration, in which, a pattern layer of source electrode and data line, a pattern layer of drain electrode and a pattern layer of pixel electrode are located on an insulating substrate, an organic semiconductor layer is located on the pattern layer of source electrode and data line and the pattern layer of drain electrode, a gate insulating layer is located on the organic semiconductor layer, and a gate electrode is located on the gate insulating layer.

An implementation example of the embodiment comprises the following steps.

Step 111, a layer of a transparent conductive thin film is firstly formed on a substrate, then a layer of metal thin film is formed, and the pattern layer of source electrode and data line, the pattern layer of drain electrode and the pattern layer of pixel electrode are formed through a first patterning process;

Step 112, an organic semiconductor layer and a gate insulating layer are prepared on the substrate subjected to the step 111, and the organic semiconductor layer and the gate insulating layer are formed through a second patterning process;

Step 113, a gate metal thin film is formed on the substrate subjected to the step 112, and a pattern layer of gate electrode and gate line is formed through a third patterning process.

Figure 1B:
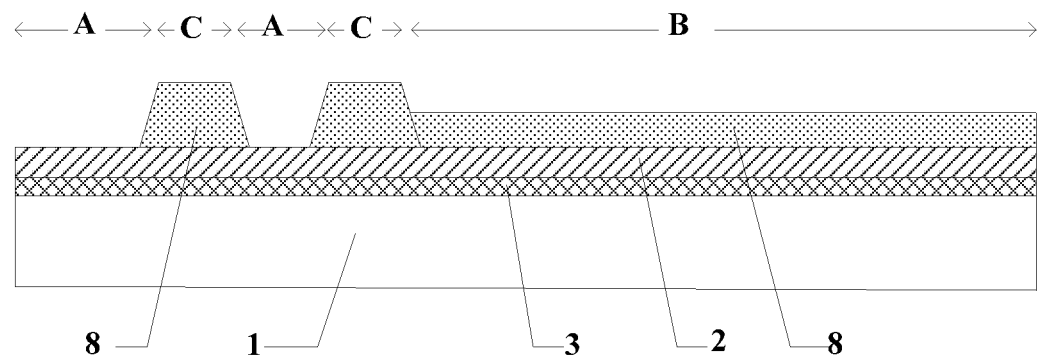
FIG. 1b is a cross-sectional view showing an OTFT after exposure and development with a half-tone or gray-tone mask in a first patterning process in the embodiment of the present disclosure.
Figure 1C:
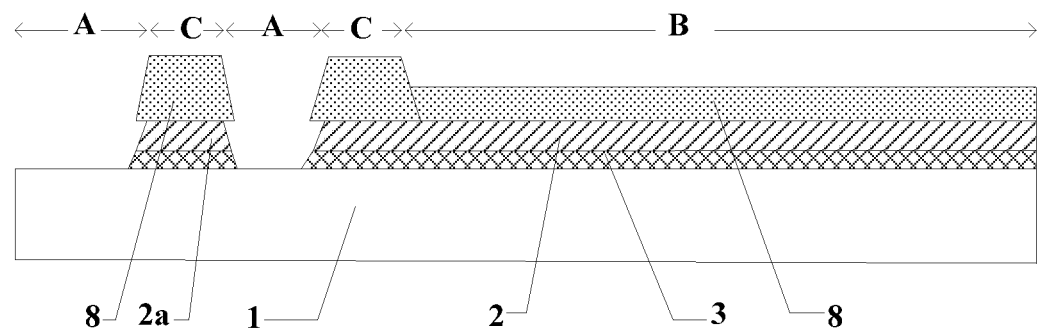
FIG. 1c is a cross-sectional view showing the OTFT after a first etching process in the first patterning process in the embodiment of the present disclosure.
Figure 1G:
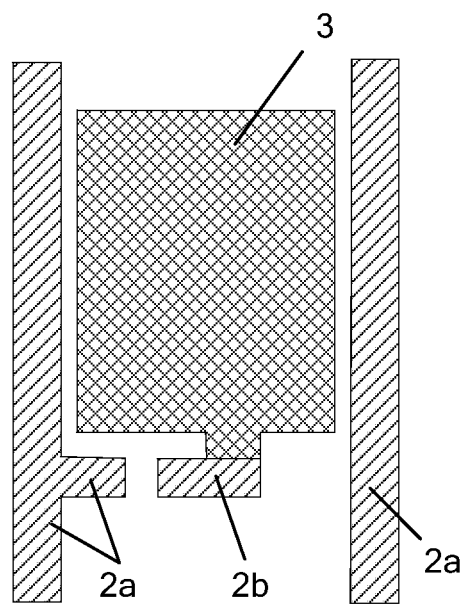
FIG. 1g is a plan view showing the OTFT after stripping off the photoresist in the first patterning process in the embodiment of the present disclosure.

For example, in the step 111, firstly, a layer of a transparent conductive thin film 3 is formed on a glass substrate 1 by means of sputtering, and then a metal thin film 2 is formed on the transparent conductive thin film. FIG. 1a is a cross-sectional view after the transparent conductive thin film and the metal thin film are formed in the embodiment. Subsequently, a layer of photoresist 8 is spin-coated and then is exposed and developed with a half-tone or gray-tone mask plate. FIG. 1b a cross-sectional view showing an OTFT after the exposure and development with the half-tone or gray-tone mask plate in the first patterning process according to the embodiment. In FIG. 1b, the region A is a photoresist removed area, the region B is a photoresist partially-retained area, and a region C is a photoresist fully-retained area. The photoresist fully-retained area corresponds to a pattern region where the source electrode and the data line and the drain electrode are to be formed, the photoresist partially-retained area corresponds to a pattern region where the pixel electrode is to be formed, and the photoresist fully-removed area corresponds to a region other than the photoresist fully-retained area and the photoresist partially-retained area and is used for formation of a channel region. With respect to the array substrate shown in FIG. 1b, a first etching process is conducted thereon by using the resultant pattern of the photoresist as an etching mask, so that the transparent conductive thin film and the metal thin film in the photoresist fully-removed area are etched away. FIG. 1c is a cross-sectional view showing the OTFT after the first etching in the first patterning process according to the embodiment. The pattern layer 2a of the source electrode and the data line are formed in region C and the photoresist 8 remains on the pattern layer 2a of the source electrode and the data line. Next, the photoresist on the array substrate shown in FIG. 1c is subjected to ashing, so that the photoresist in the photoresist partially-retained area is removed, and meanwhile the photoresist fully-retained area is also removed partially and becomes thinner. FIG. 1d is a cross-sectional view showing the OTFT after ashing of the photoresist in the second patterning process according to the embodiment. Then, a second etching process is conducted on the array substrate shown in FIG. 1d, so that the metal thin film in the photoresist partially-retained area is etched away and the pattern layer of pixel electrode is obtained. FIG. 1e is a cross-sectional view showing the OTFT after the second etching in the first patterning process according to the embodiment. After the photoresist is stripped off, the pattern layer 2a of the source electrode and the data line, the pattern layer of the drain electrode 2b, and the pattern layer of the pixel electrode 3 are obtained. FIG. 1f is a cross-sectional view showing the OTFT after stripping off the photoresist in the first patterning process according to the embodiment. FIG. 1g is a plan view showing the OTFT after stripping of the photoresist in the first patterning process according to the embodiment.

Figure 2A:
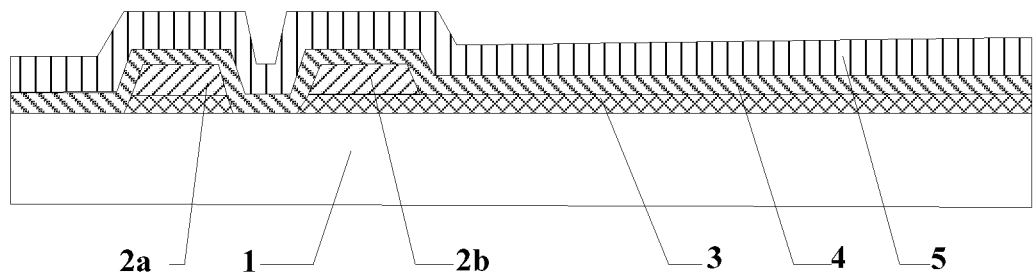
FIG. 2a is a cross-sectional view after thin films for an organic semiconductor layer and a gate insulating layer are manufactured in the embodiment of the present disclosure.
Figure 2B:
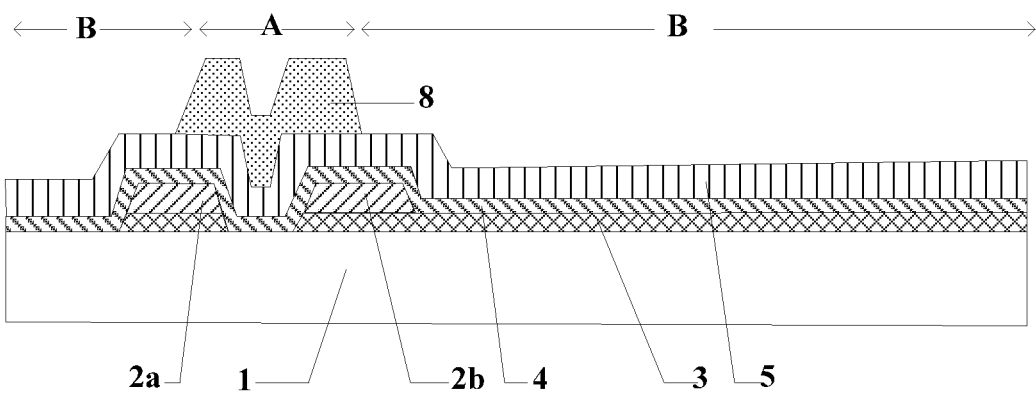
FIG. 2b is a cross-sectional view showing the OTFT after exposure and development with a mask in a second patterning process in the embodiment of the present disclosure.
Figure 2C:
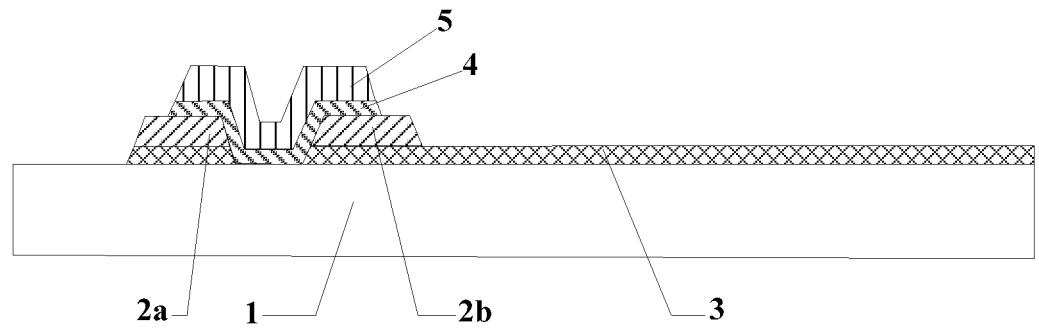
FIG. 2c is a cross-sectional view showing the OTFT after an etching process in the second patterning process in the embodiment of the present disclosure.
Figure 2D:
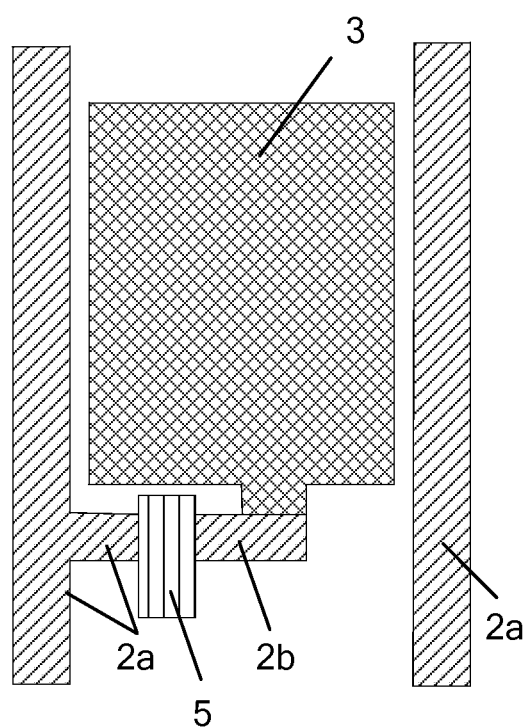
FIG. 2d is a cross-sectional view of FIG. 2c along the direction of A-A in the embodiment of the present disclosure.

In the step 112, on the substrate subjected to the step 111, by means of vacuum evaporation, an organic-semiconductor-layer thin film 4 of vanadyl phthalocyanine for example, the thickness of which is 50 nm, is fabricated; and then, a gate-insulating-layer thin film 5 of polyvinyl phenol (PVP) for example, the thickness of which is 550 nm, is fabricated by means of spin-coating, and is baked at a temperature of smaller than 100° C. for 20 minutes, and then at a temperature of larger than 130° C. for 20 minutes. FIG. 2a is a cross-sectional view after the organic-semiconductor-layer thin film 4 and the gate-insulating-layer thin film 5 are manufactured according to the embodiment. After that, a layer of photoresist 8 is spin-coated on the gate-insulating-layer thin film 5, and exposure and development are conducted on the photoresist 8 with a mask plate. FIG. 2b is a cross-sectional view showing the OTFT after exposure and development with the mask plate in the second patterning process according to the embodiment. In FIG. 2b, a region A is a photoresist fully-retained area, and a region B is a photoresist removed area. The photoresist fully-retained area corresponds to a pattern region where the organic semiconductor and the gate insulating layer are to be formed. With respect to the glass substrate shown in FIG. 2b, an etching process is carried out so that the insulating-layer thin film and the organic-semiconductor-layer thin film in the photoresist fully-removed area are etched away. FIG. 2c is a cross-sectional view showing the OTFT after the etching process in the second patterning process according to the embodiment, and FIG. 2d is a plan view showing the OTFT after the etching process in the second patterning process according to the embodiment.

Figure 3B:
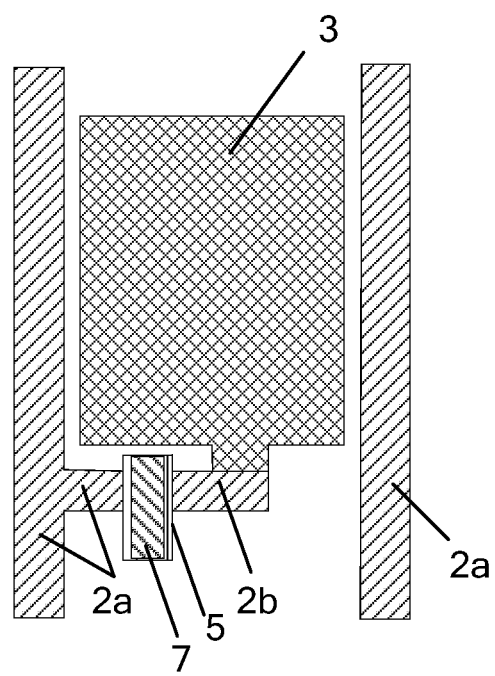
FIG. 3b is a plan view showing the OTFT after the third patterning process in the embodiment of the present disclosure.
Figure 4:
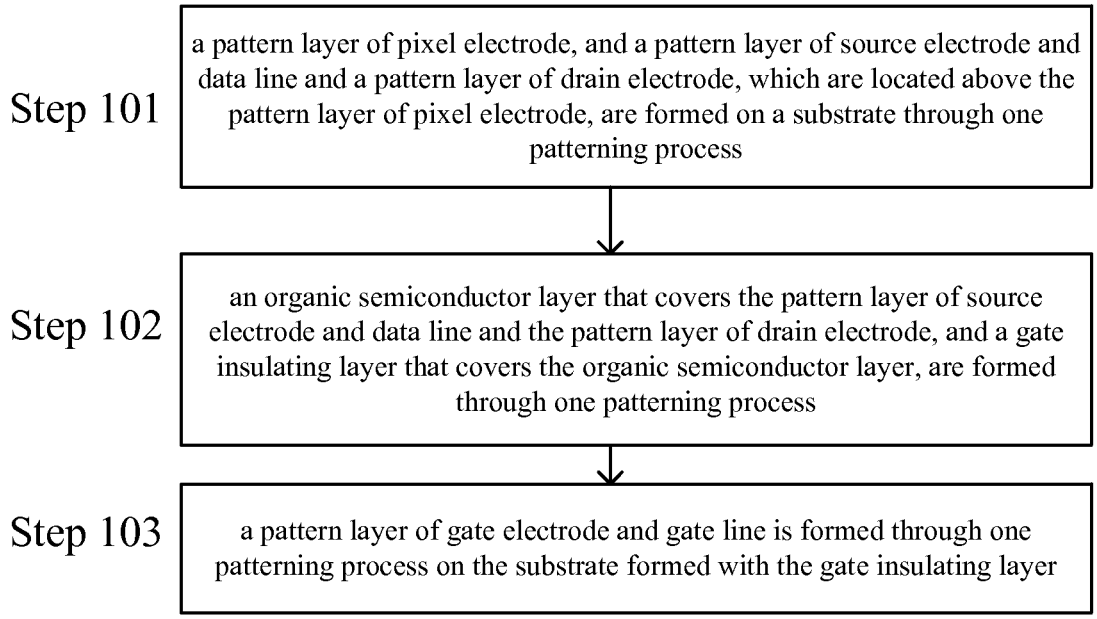
FIG. 4 is a flow chart showing steps of a method for manufacturing an organic thin film transistor OTFT array substrate in an embodiment of the present disclosure.
Figure 5:
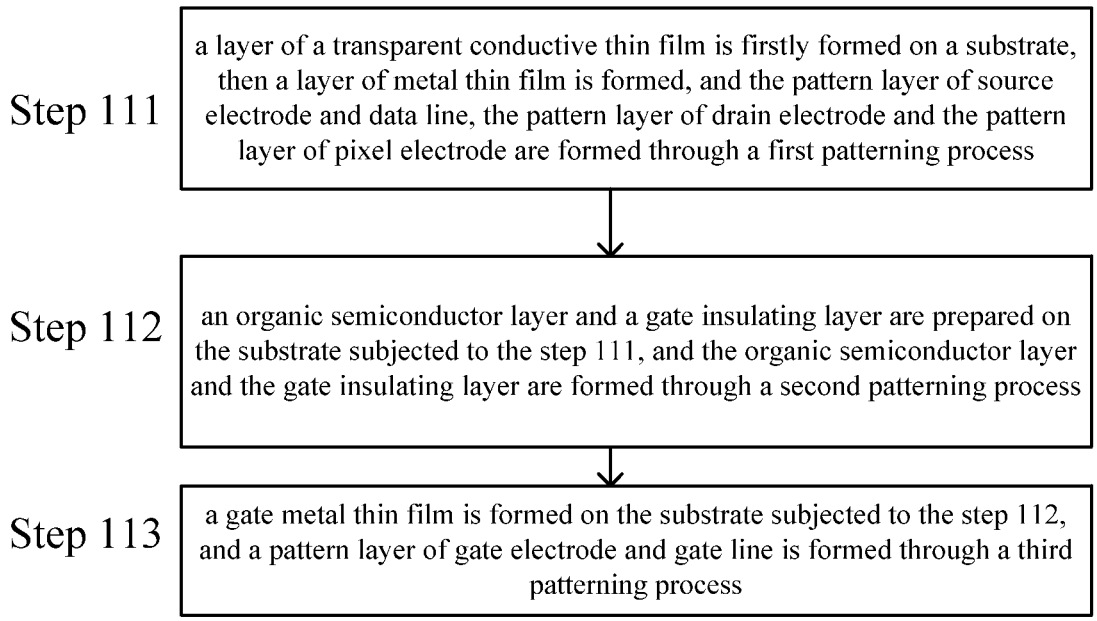
FIG. 5 is a flow chart showing sub-steps of a method for manufacturing an OTFT array substrate in an embodiment of the present disclosure.
Figure 6:
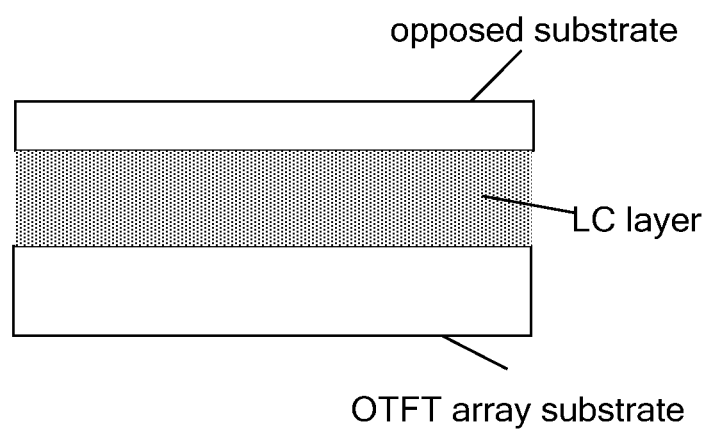
FIG. 6 is a cross-sectional view showing a display device which includes an OTFT array substrate in an embodiment of the present disclosure.

In the step 113, a gate metal thin film is formed on the substrate subjected to the step 112, and after formation of the gate metal thin film, the pattern layer 7 of the gate electrode and the gate line is formed through the third patterning process. FIG. 3a is a cross-sectional view showing the OTFT after the third patterning process according to the embodiment; and FIG. 3b is a corresponding plan view.

Three patterning processes are used in the embodiment. By way of forming the pattern layer of source electrode and data line and the pattern layer of pixel electrode in one patterning, forming the organic semiconductor layer and the gate insulating layer in one patterning, and forming the gate electrode and the gate line in one patterning process, the fabricating process is simplified, the fabrication cost is reduced, the fabrication time is shortened, and the fabrication efficiency is improved.

According to an embodiment of the present disclosure, there is further provided an organic thin film transistor array substrate, which is an array substrate obtained by using the method for manufacturing the array substrate as described in the above embodiment. As shown in FIG. 3a, within a pixel region defined by a gate line and a data line crossing over each other on the array substrate, there are formed a pattern layer of a pixel electrode 3 and an organic thin film transistor on a glass substrate 1. The organic thin film transistor includes a pattern layer 2a of a source electrode and a data line and a pattern layer of a drain electrode 2b that are located above the pattern layer of the pixel electrode 3, an organic semiconductor layer 4 that covers the pattern layer 2a of the source electrode and the data line and the pattern layer of the drain electrode 2b, a gate insulating layer 5 that covers the organic semiconductor layer 4, and a pattern layer 7 of a gate electrode and a gate line that covers the gate insulating layer 5. The organic thin film transistor array substrate provided by the embodiment of the present disclosure can be formed by using three patterning processes, wherein the pattern layer of source electrode and data line and the pattern layer of pixel electrode are formed in one patterning, the organic semiconductor layer and the gate insulating layer are formed in one patterning, and the gate electrode and the gate line are formed in one patterning process. Thus, the fabricating process is simplified, the fabrication cost is reduced, the fabrication time period is shortened, and the fabrication efficiency is increased.

According to an embodiment of the present disclosure, there is further provided a display device, comprising the organic thin film transistor array substrate manufactured by the above method for manufacturing the organic thin film transistor.

The display device provided by the embodiment of the present disclosure may be a liquid crystal panel, an electronic paper, an OLED panel, a liquid crystal television, a liquid crystal display, a digital photo frame, a cell phone, a tablet computer, or any other product or component possessing a display function.

The descriptions made above are merely exemplary embodiments of the present disclosure, but are not used to limit the protection scope of the present disclosure. The protection scope of the present disclosure is determined by attached claims.

The invention claimed is:

1. A method for manufacturing an organic thin film transistor array substrate, comprising:
   forming a pattern layer of pixel electrode, a pattern layer of source electrode and data line, and a pattern layer of drain electrode on a substrate through one patterning process, wherein the pattern layer of source electrode and data line and the pattern layer of drain electrode are both located above the pattern layer of pixel electrode;
   forming an organic semiconductor layer that covers the pattern layer of source electrode and data line and the pattern layer of drain electrode, and a gate insulating layer that covers the organic semiconductor layer through one patterning process, wherein the organic semiconductor layer and the gate insulating layer possess a same pattern; and
   forming a pattern layer of gate electrode and gate line through one patterning process on the substrate formed with the gate insulating layer;
   wherein forming of the organic semiconductor layer that covers the pattern layer of source electrode and data line and the pattern layer of drain electrode and the gate insulating layer that covers the organic semiconductor layer through one patterning process comprises:
      forming a thin film for the organic semiconductor layer that covers the pattern layer of source electrode and data line and the pattern layer of drain electrode;
      forming a thin film for the gate insulating layer that covers the thin film for the organic semiconductor layer;
      spin-coating photoresist on the thin film for the gate insulating layer, and conducting exposure with a mask plate and development on the photoresist, so as to obtain a photoresist removed area and a photoresist fully-retained area;
      performing an etching process on the substrate so as to etch away the thin film for the gate insulating layer and the thin film for the organic semiconductor layer in the photoresist fully-removed area; and
      stripping off the photoresist in the photoresist fully-retained area, so as to obtain the organic semiconductor layer and the gate insulating layer;
   wherein after formation of the thin film for the gate insulating layer and before spin-coating of the photoresist on the thin film for the gate insulating layer, the method further comprises:
      baking the substrate at a first preset temperature for a first preset time period, and then baking the substrate at a second preset temperature that is larger than the first preset temperature for a second preset time period, wherein the first preset time is equal to the second preset time.

2. The method claimed as claim 1, wherein forming of the pattern layer of pixel electrode, and the pattern layer of source electrode and data line and the pattern layer of drain electrode, which are located above the pattern layer of pixel electrode, on the substrate through one patterning process comprises:
   forming a transparent conductive thin film on the substrate and forming a metal thin film on the transparent conductive thin film;
   spin-coating photoresist on the metal thin film, and conducting exposure with a mask plate and development on the photoresist, so as to obtain a photoresist removed area, a photoresist partially-retained area and a photoresist fully-retained area;
   performing an etching process on the substrate so as to etch away the transparent conductive thin film and the metal thin film in the photoresist fully-removed area;
   conducting an ashing process on the photoresist on the substrate so as to remove the photoresist in the photoresist partially-retained area;
   performing an etching process on the substrate so as to etch away the metal thin film in the photoresist partially-retained area and obtain the pattern layer of pixel electrode; and
   stripping off the photoresist in the photoresist fully-retained area so as to obtain the pattern layer of source electrode and data line and the pattern layer of drain electrode.

3. The method claimed as claim 2, wherein the mask plate is a half-tone mask plate or a gray-tone mask plate.

4. The method claimed as claim 1, wherein forming of the pattern layer of gate electrode and gate line through one patterning process on the substrate formed with the gate insulating layer comprises:
   forming a gate metal thin film on the substrate formed with the gate insulating layer;
   spin-coating photoresist on the gate metal thin film, and conducting exposure with a mask plate and development on the photoresist, so as to obtain a photoresist fully-removed area and a photoresist fully-retained area;
   performing an etching process on the substrate so as to etch away the gate metal thin film in the photoresist fully-removed area; and
   stripping off the photoresist, so as to obtain the pattern layer of gate electrode and gate line.

5. An organic thin film transistor array substrate, which is manufactured by the method claimed as claim 1.

6. A display device, comprising the organic thin film transistor array substrate claimed as claim 5.

7. The method claimed as claim 2, wherein forming of the pattern layer of gate electrode and gate line through one patterning process on the substrate formed with the gate insulating layer comprises:
   forming a gate metal thin film on the substrate formed with the gate insulating layer;
   spin-coating photoresist on the gate metal thin film, and conducting exposure with a mask plate and development on the photoresist, so as to obtain a photoresist fully-removed area and a photoresist fully-retained area;
   performing an etching process on the substrate so as to etch away the gate metal thin film in the photoresist fully-removed area; and
   stripping off the photoresist, so as to obtain the pattern layer of gate electrode and gate line.

* * * * *